United States Patent
Choi et al.

(10) Patent No.: US 11,296,159 B2
(45) Date of Patent: Apr. 5, 2022

(54) DISPLAY DEVICE COMPRISING A FIRST PARTITION WALL AND A SECOND PARTITION WALL

(71) Applicant: Samsung Display Co., Ltd., Yongin-si (KR)

(72) Inventors: Nak Cho Choi, Yongin-si (KR); Dae-Gi Kweon, Anyang-si (KR); Ji hee Kim, Suwon-si (KR); Kie Hyun Nam, Seongnam-si (KR); Min Yeul Ryu, Suwon-si (KR); Sang Hee Yu, Hwaseong-si (KR); Jun Hee Lee, Hwaseong-si (KR); Da-young Jung, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 82 days.

(21) Appl. No.: 16/734,980

(22) Filed: Jan. 6, 2020

(65) Prior Publication Data
US 2020/0328263 A1    Oct. 15, 2020

(30) Foreign Application Priority Data
Apr. 10, 2019  (KR) .................. 10-2019-0042015

(51) Int. Cl.
*H01L 27/32* (2006.01)
*H01L 51/50* (2006.01)
*H01L 51/52* (2006.01)

(52) U.S. Cl.
CPC ........ *H01L 27/3246* (2013.01); *H01L 51/502* (2013.01); *H01L 51/5218* (2013.01);
(Continued)

(58) Field of Classification Search
CPC combination set(s) only.
See application file for complete search history.

(56) References Cited

U.S. PATENT DOCUMENTS

| 5,705,857 A | 1/1998 | Farooq et al. |
| 8,253,128 B2 | 8/2012 | Kim et al. |
| (Continued) | | |

FOREIGN PATENT DOCUMENTS

| EP | 3331046 A1 | 6/2018 |
| JP | 2004-281365 A | 10/2004 |
| (Continued) | | |

OTHER PUBLICATIONS

EPO Extended Search Report dated Sep. 3, 2020, issued in corresponding European Patent Application No. 20157007.4 (8 pages).

*Primary Examiner* — Nduka E Ojeh
(74) *Attorney, Agent, or Firm* — Lewis Roca Rothgerber Christie LLP

(57) ABSTRACT

An embodiment of the present disclosure provides a display device including a substrate, a thin film transistor on the substrate, a first electrode electrically connected to the thin film transistor, a light emitting layer and a second electrode overlapping the first electrode, a first partition wall between the first electrode and the second electrode, and a second partition wall overlapping the first partition wall, wherein the first partition wall includes at least one of a black pigment and a black dye, wherein the second partition wall includes an organic insulating material, and wherein a portion of the second partition wall overlaps the first electrode.

20 Claims, 15 Drawing Sheets
(2 of 15 Drawing Sheet(s) Filed in Color)

(52) U.S. Cl.
CPC ...... *H01L 51/5253* (2013.01); *H01L 51/5284* (2013.01); *H01L 2251/558* (2013.01)

(56) References Cited

U.S. PATENT DOCUMENTS

| | | | |
|---|---|---|---|
| 2010/0133993 A1* | 6/2010 | Pang | H01L 27/3246 |
| | | | 313/504 |
| 2011/0272715 A1* | 11/2011 | Kang | H01L 27/3246 |
| | | | 257/88 |
| 2014/0035456 A1 | 2/2014 | Isa | |
| 2014/0346485 A1 | 11/2014 | Noda et al. | |
| 2017/0373124 A1* | 12/2017 | Yang | H01L 27/3246 |
| 2018/0033836 A1* | 2/2018 | Lee | H01L 27/3258 |
| 2018/0033848 A1 | 2/2018 | Jung et al. | |
| 2018/0033967 A1* | 2/2018 | Bang | H01L 51/5092 |
| 2018/0151828 A1 | 5/2018 | Im et al. | |
| 2019/0006625 A1 | 1/2019 | Toyoda | |
| 2019/0165058 A1* | 5/2019 | Managaki | H01L 27/1255 |
| 2019/0173011 A1* | 6/2019 | Kwak | H01L 27/3223 |
| 2020/0176530 A1* | 6/2020 | Baek | H01L 27/156 |
| 2020/0203667 A1* | 6/2020 | Youn | H01L 51/5271 |

FOREIGN PATENT DOCUMENTS

| | | |
|---|---|---|
| JP | 2006-89597 A | 4/2006 |
| JP | 2016-48696 A | 4/2016 |
| KR | 10-0526930 B1 | 11/2005 |
| KR | 10-0573134 B1 | 4/2006 |
| KR | 10-0782458 B1 | 12/2007 |
| KR | 10-2015-0087997 A | 7/2015 |
| KR | 10-2018-0047592 A | 5/2018 |
| KR | 10-1878186 B1 | 8/2018 |

\* cited by examiner

DISPLAY DEVICE COMPRISING A FIRST PARTITION WALL AND A SECOND PARTITION WALL

CROSS-REFERENCE TO RELATED APPLICATION

This application claims priority to, and the benefit of, Korean Patent Application No. 10-2019-0042015 filed in the Korean Intellectual Property Office on Apr. 10, 2019, the entire contents of which are incorporated herein by reference.

BACKGROUND

1. Field

The present disclosure relates to a display device.

2. Description of the Related Art

A light emitting display device includes two electrodes and a light emitting layer located therebetween. An electron injected from a cathode, which is one electrode, and a hole injected from an anode, which is the other electrode, are coupled with each other in the light emitting layer to generate an exciton, and the exciton emits energy to emit light.

The light emitting display device includes a plurality of pixels including a light emitting diode, which includes a cathode, an anode, and a light emitting layer, and each pixel includes a plurality of transistors and capacitors for driving the light emitting diode.

The above information disclosed in this Background section is only for enhancement of understanding of the background of the present disclosure, and therefore it may contain information that does not form the prior art.

SUMMARY

The present disclosure describes a display device that is excellent in reliability with respect to external light exposure, and in which a defect such as a dark spot is controlled.

An embodiment of the present disclosure provides a display device including a substrate, a thin film transistor on the substrate, a first electrode electrically connected to the thin film transistor, a light emitting layer and a second electrode overlapping the first electrode, a first partition wall between the first electrode and the second electrode, and a second partition wall overlapping the first partition wall, wherein the first partition wall includes at least one of a black pigment and a black dye, wherein the second partition wall includes an organic insulating material, and wherein a portion of the second partition wall overlaps the first electrode.

An end of the second partition wall may contact the first electrode, wherein a width of an area at which the second partition wall and the first electrode contact each other is about 2 micrometers or more.

The second partition wall may include a first region and a second region that have different thicknesses.

The display device may further include an encapsulation layer on the second electrode, wherein the second region supports the encapsulation layer.

The first electrode may include a first layer, a second layer, and a third layer, wherein each of the first layer and the third layer includes ITO, IZO, ZnO, $In_2O_3$, IGO, or AZO, and wherein the second layer includes Ag, Mg, Al, Pt, Pd, Au, Ni, Nd, Ir, Cr, or a compound thereof.

A surface of the first electrode may define a groove exposing the second layer.

The display device may further include a third partition wall on the second partition wall.

The second partition wall may be on the first electrode, wherein the first partition wall is on the second partition wall.

The second partition wall may include a first region and a second region that have different thicknesses.

The first partition wall may be on an upper surface of the second partition wall.

The first partition wall may overlap the upper surface and two lateral surfaces of the second partition wall.

The display device may further include a third partition wall on the first partition wall.

The third partition wall and the second partition wall may include the same material.

The third partition wall may contact an upper surface of the second partition wall.

The display device may further include an insulating layer between the thin film transistor and the first electrode, wherein the first partition wall and the second partition wall contact the insulating layer.

The first partition wall may be spaced apart from the first electrode.

Another embodiment of the present disclosure provides a display device including a substrate, a thin film transistor on the substrate, a first electrode connected to the thin film transistor, an insulating layer between the first electrode and the thin film transistor, a first partition wall and a second partition wall overlapping the insulating layer, and a light emitting layer and a second electrode overlapping the first electrode, wherein an end of the second partition wall contacts an upper surface of the first electrode.

An amount of sulfur (S) in the first partition wall may be less than an amount of sulfur (S) in the second partition wall.

An amount of at least one of a black pigment and a black dye in the first partition wall may be greater than an amount of at least one of a black pigment and a black dye included in the second partition wall.

The second partition wall may include a first region and a second region that have different thicknesses.

The display device may further include an encapsulation layer, wherein a thickness of the second region is greater than that of the first region, and wherein the second region supports the encapsulation layer.

The light emitting layer may include a quantum dot.

The second partition wall may contact a lateral surface of the first partition wall and an upper surface of the first electrode.

According to the described embodiments, it is possible to provide a display device having high reliability with respect to external light and a low dark spot defect ratio.

BRIEF DESCRIPTION OF THE DRAWINGS

The patent or application file contains at least one drawing executed in color. Copies of this patent or patent application publication with color drawings will be provided by the Office upon request and payment of the necessary fee.

DETAILED DESCRIPTION

Figure 1:
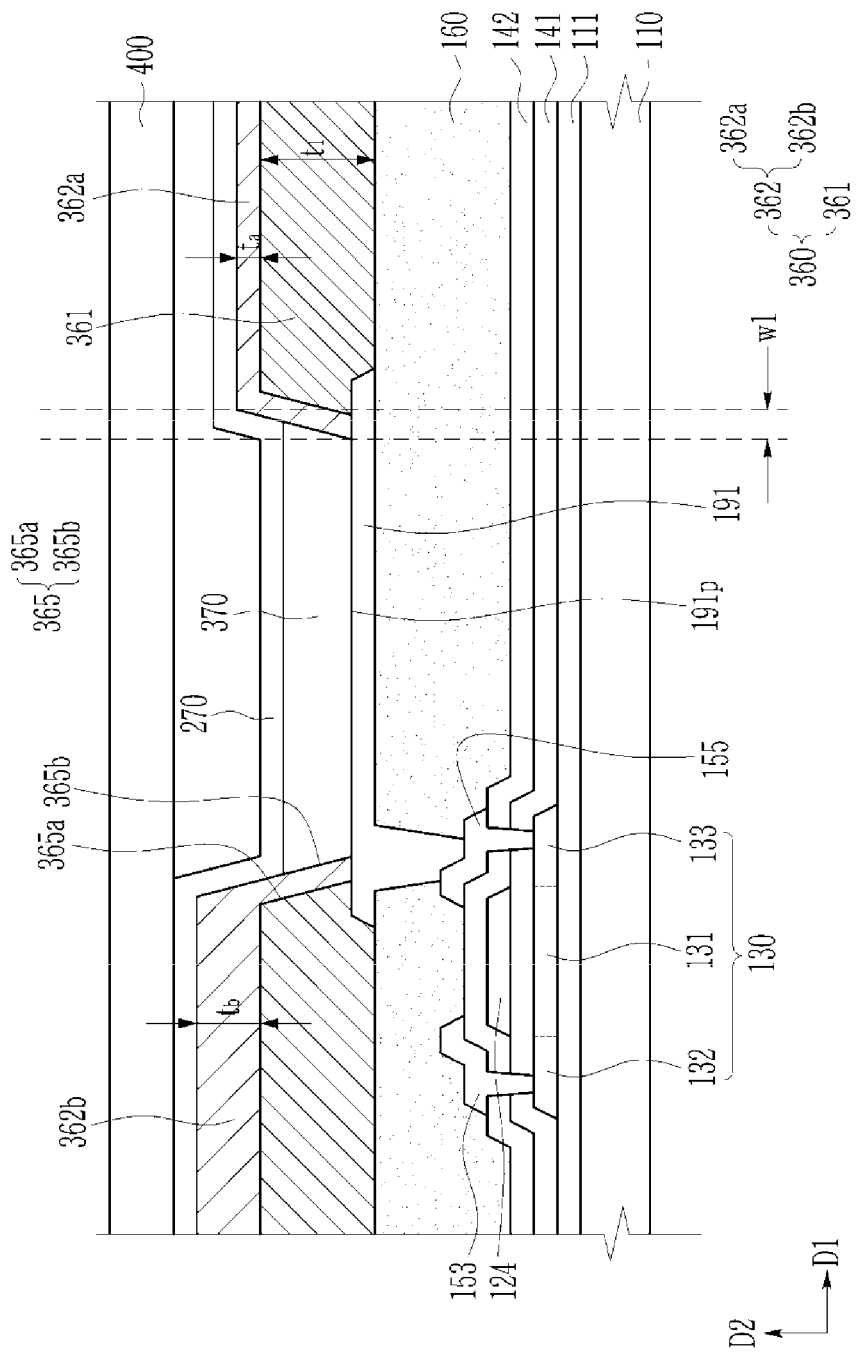
FIG. 1 illustrates a cross-sectional view of a display device according to an embodiment.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described.

Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Further, throughout the specification, the phrase "on a plane" means viewing a target portion from the top, and the phrase "on a cross-section" means viewing a cross-section formed by vertically cutting a target portion from the side.

Figure 2:
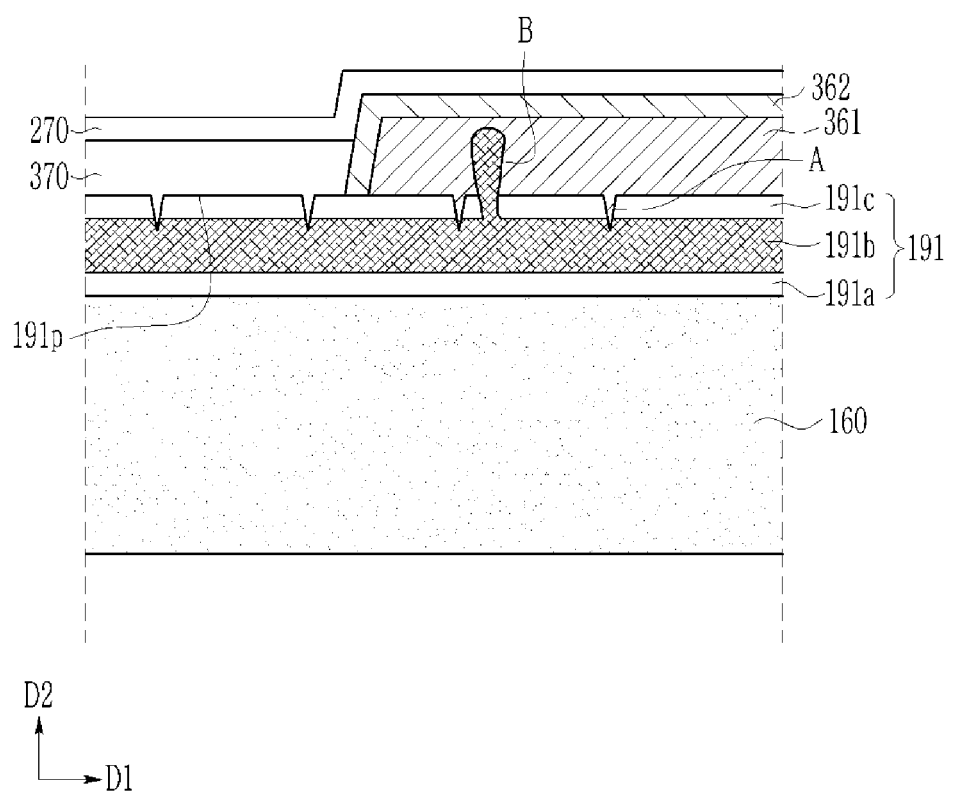
FIG. 2 illustrates an enlarged view of a portion of a display device according to an embodiment.

Hereinafter, a display device according to an embodiment will be described with reference to FIG. 1 and FIG. 2. FIG. 1 illustrates a cross-sectional view of a display device according to an embodiment, and FIG. 2 illustrates an enlarged view of a portion of a display device according to an embodiment.

First, referring to FIG. 1, a substrate 110 may include a transparent glass substrate, or may include a substrate in which a plastic layer and a barrier layer are alternately stacked. The substrate 110 according to the present embodiment may be a flat substrate or a flexible substrate that may be bendable, foldable, or rollable.

A buffer layer 111 is located on the substrate 110. The buffer layer 111 may reduce or prevent impurities or the like from diffusing from the substrate 110 toward the inside of the display device. In addition, the buffer layer 111 may improve flatness of a surface of the substrate 110 when the surface of the substrate 110 is not uniform.

The buffer layer 111 may include an inorganic insulating material such as a silicon oxide, a silicon nitride, or the like, or an organic insulating material. The buffer layer 111 may be a single layer or a multilayer. For example, when the buffer layer 111 is a dual layer, a lower layer thereof may include a silicon nitride, and an upper layer thereof may include a silicon oxide, but the present disclosure is not limited thereto.

A semiconductor layer 130 is located on the buffer layer 111. The semiconductor layer 130 may include amorphous silicon, polycrystalline silicon, an oxide semiconductor, and the like, but is not limited thereto.

The semiconductor layer 130 may include a source region 132 connected to a source electrode 153, a drain region 133 connected to a drain electrode 155, and a channel region 131 located between the source region 132 and the drain region 133, which will be described later. The source region 132 and the drain region 133 may be respectively doped with an impurity.

A first insulating layer 141 is located on the semiconductor layer 130 and the buffer layer 111. The first insulating layer 141 may include an inorganic insulating material, such as a silicon nitride, a silicon oxide, a metal oxide, or the like, or may include an organic insulating material. The first insulating layer 141 may be a single film or a multi-film.

A gate electrode 124 is located on the first insulating layer 141. The gate electrode 124 overlaps the channel region 131 of the semiconductor layer 130.

The gate electrode 124 may include at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The gate electrode 124 may include a single film or a multi-film.

A second insulating layer 142 may be located on the gate electrode 124 and the first insulating layer 141. The second insulating layer 142 may include an inorganic insulating material such as a silicon nitride, a silicon oxide, or a metal oxide, or may include an organic insulating material.

The source electrode 153 and the drain electrode 155 may be located on the second insulating layer 142.

The source electrode 153 and the drain electrode 155 may include at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode 153 and the drain electrode 155 may include a single film or a multi-film.

Each of the source electrode 153 and the drain electrode 155 may be respectively connected to the source region 132 and the drain region 133 of the semiconductor layer 130 through contact holes of the first insulating layer 141 and the second insulating layer 142.

A third insulating layer 160 is located on the source electrode 153 and the drain electrode 155. The third insulating layer 160 may cover the source electrode 153 and the drain electrode 155 to flatten them or to provide a planar layer thereon. The third insulating layer 160 may include an organic insulating material or an inorganic insulating material. The third insulating layer 160 may be a single film or a multi-film.

A first electrode 191 is located on the third insulating layer 160. The first electrode 191 may be connected to the drain electrode 155 through a contact hole of the third insulating layer 160.

The first electrode 191 may be a transparent electrode, a transflective electrode, or a reflective electrode. When the first electrode 191 is a transparent electrode or a transflective electrode, and the first electrode 191 may be formed of ITO, IZO, ZnO, $In_2O_3$, IGO, or AZO, as an example. When the first electrode 191 is a reflective electrode, the first electrode 191 may include a reflective film including Ag, Mg, Al, Pt, Pd, Au, Ni, Nd, Ir, Cr, or a compound thereof, and a layer including ITO, IZO, ZnO, $In_2O_3$, IGO, or AZO. However, the first electrode 191 is not limited thereto, and the first electrode 191 may include various materials, and may have variously modified structures, such as a single layer structure or a multi-layer structure. The first electrode 191 according to the present embodiment may have a triple layer structure, and may have a multi-layer structure in which ITO, Ag, and ITO are sequentially stacked.

A partition wall 360 may be located on the first electrode 191 and on the third insulating layer 160. The partition wall 360 includes an opening portion 365 that exposes a portion of the first electrode 191. A light emitting layer 370 may be located in the opening portion 365. An exposed region may be a light emitting region that is not covered by the partition wall 360, and a region in which the partition wall 360 is located may be a non-light emitting region.

The partition wall 360 may include a first partition wall 361 and a second partition wall 362. A size of a first opening portion 365a of the first partition wall 361 and a size of a second opening portion 365b of the second partition wall 362 may be different. A planar size of the first opening portion 365a of the first partition wall 361 may be larger than a planar size of the second opening portion 365b of the second partition wall 362. A lateral surface of the first opening portion 365a may be in contact with the second partition wall 362. An end of the second partition wall 362 may contact an upper surface 191p of the first electrode 191 while covering an end of the first partition wall 361.

The first partition wall 361 may overlap a portion of the first electrode 191. The first partition wall 361 may overlap the end of the first electrode 191, and the first partition wall 361 may be located on the third insulating layer 160, according to an embodiment. The first partition wall 361 may be located between the third insulating layer 160 and the second partition wall 362. For example, the first partition wall 361 may contact the third insulating layer 160.

The first partition wall 361 may include an organic insulating material such as an acrylic organic compound, a polyimide, and/or a polyamide, but is not limited thereto. In addition, the first partition wall 361 may further include a photoinitiator and the like. The first partition wall 361 may be formed by using a negative photosensitive resin composition.

The first partition wall 361 according to the present embodiment may include at least one of a black pigment and a black dye. The black pigment according to the present embodiment may include black pigment particles for absorbing external light, and may include a dispersant bonded to the black pigment particles, but is not limited thereto, and may instead include only black pigment particles in which a dispersant is omitted. In addition, the black dye according to the present embodiment may include black dye particles for absorbing external light and a dispersant bonded to the black dye particles, but is not limited thereto, and may instead include only the black dye particles in which the dispersant is omitted.

The first partition wall 361 may absorb external light, and/or may reduce or prevent light leakage. For example, the first partition wall 361 including at least one of the black pigment and the black dye reduces or prevents external light from penetrating into the third insulating layer 160, thereby reducing or preventing out-gassing from occurring in the third insulating layer 160 and the like. When the out-gassing otherwise occurs, oxidation of the first electrode or the like may occur, thus reliability of the display device may be degraded.

In addition, the first partition wall 361 may reduce a phenomenon in which external light is reflected by a metal wire, such as a gate line or a data line, to be viewed as light leakage. Accordingly, the first partition wall 361 thereby increases the display quality of the display device.

The second partition wall 362 may be located on the first partition wall 361. The second partition wall 362 may overlap a portion of the first electrode 191.

The second partition wall 362 may include an organic insulating material, such as an acrylic organic compound, a polyimide, and/or a polyamide. The second partition wall 362 may be made transparent by using, for example, a positive photosensitive resin composition, but is not limited thereto.

Unlike the first partition wall 361, the second partition wall 362 may omit a black pigment and a black dye. Therefore, an amount of at least one of the black pigment and the black dye included in the first partition wall 361 may be larger than an amount of the black pigment and the black dye included in the second partition wall 362.

The second partition wall 362 may include a compound represented by Chemical Formula 1. The compound represented by Chemical formula 1 may contain an S—O bond. Therefore, an amount of sulfur (S) contained in the second partition wall 362 may be larger than an amount of sulfur (S) contained in the first partition wall 361.

[Chemical Formula 1]

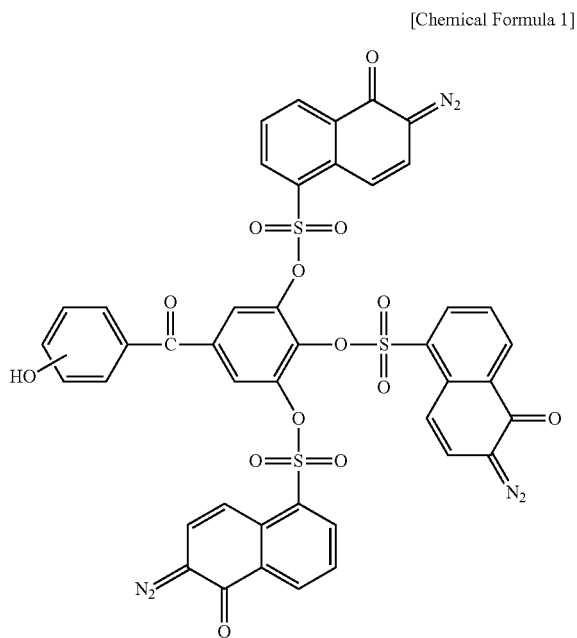

The second partition wall 362 may include a first region 362a and a second region 362b. A maximum thickness $t_a$ of the first region 362a and a maximum thickness $t_b$ of the second region 362b may be different. In some embodiments, the maximum thickness $t_b$ of the second region 362b may be at least twice the maximum thickness $t_a$ of the first region 362a.

The second region 362b of the second partition wall 362 may have a relatively thick thickness. The second region 362b may serve as a spacer. The second partition wall 362 may have elasticity (e.g., predetermined elasticity), and may support an encapsulation layer 400 to be described later.

The first region 362a and the second region 362b may be manufactured by the same process. For example, a region overlapping the second opening portion 365b may be manufactured by being exposed by a mask opening portion, a region overlapping the first region 362a may be manufactured by overlapping a halftone mask, and a region overlapping the second region 362b may be manufactured by overlapping a mask light blocking portion. The portion exposed by the mask opening portion may be eliminated to form the second opening portion 365b, and the region overlapping the mask light blocking portion may form the second region 362b having the second thickness $t_b$, while the region overlapping the halftone mask may form the first region 362a having the first thickness $t_a$. In this case, the first thickness $t_a$ of the region overlapping the halftone mask may be varied according to an exposure amount. As the exposure amount increases, the first thickness $t_a$ may be reduced. However, even if the exposure amount increases, the second thickness $t_b$ may be constant.

A thickness $t_1$ of the first partition wall 361 according to the present embodiment may be from about 0.5 micrometers to about 3 micrometers. The first thickness $t_a$ and the second thickness $t_b$ of the second partition wall 362 may be from about 0.3 micrometers to about 1 micrometer, and they may satisfy the above-mentioned condition.

The second partition wall 362 may contact the upper surface 191p of the first electrode 191. When a width of an area in which the second partition wall 362 and the upper surface 191p of the first electrode 191 are in contact with each other is referred to as a first width w1. The first width w1 may be about 2 micrometers or more. When the first width w1 is less than about 2 micrometers, a defect ratio of a dark spot may be about 10% or more. To reduce the defect ratio of the dark point of the display device, the first width may satisfy the above-mentioned value.

Hereinafter, the embodiment will be more specifically described with referring to FIG. 2.

Referring to FIG. 2, the first electrode 191 according to the present embodiment may have a triple-layer structure. The first electrode 191 may include a first layer 191a, a second layer 191b, and a third layer 191c. In this case, the first layer 191a and the third layer 191c may include at least one of ITO, IZO, ZnO, $In_2O_3$, IGO, and AZO, and the second layer 191b may include at least one of Ag, Mg, Al, Pt, Pd, Au, Ni, Nd, Ir, Cr, and a compound thereof.

The upper surface 191p of the first electrode 191 formed of the triple layer may include a partially recessed groove A. The groove A may be a surface shape that is naturally formed in a process of forming the first electrode 191.

A metal included in the second layer 191b may grow through the groove A, and, for example, the metal may grow in the first partition wall 361. Thus, the metal included in the second layer 191b may generate a metal defect (B) of a swollen state as shown in FIG. 2. In addition, in other examples, the second layer 191b exposed at the end of the first electrode 191 may also grow along the first partition wall 361.

The display device according to the present embodiment includes the second partition wall 362 covering the first partition wall 361. The second partition wall 362 may reduce or prevent the above-described metal defect B from growing. A pixel defect may be reduced through control of the metal defect (B). The second partition wall 362 may include a compound represented by Chemical Formula 1, and the —SO bond included in the compound may limit growth of the metal defect (B).

In the absence of the second partition wall 362, the metal defect (B) may continue to grow, and in this case, a short circuit may occur when the metal defect (B) contacts the common electrode 270, or while a field concentration occurs in a corresponding region. A pixel including the metal defect (B) becomes a dark spot to cause a pixel defect.

Referring again to FIG. 1, the light emitting layer 370 is located on the first electrode 191 exposed by the opening portion 365. A common electrode 270, which is a second electrode overlapping a front surface of the substrate 110, is located on the light emitting layer 370 and the partition wall 360. The first electrode 191, the light emitting layer 370, and the common electrode 270 may form a light emitting diode.

The common electrode 270 may be a transparent electrode, a transflective electrode, or a reflective electrode. When the common electrode 270 is a transparent electrode or a transflective electrode, the common electrode 270 may include a layer including a metal having a small work function, for example, Li, Ca, LiF/Ca, LiF/Al, Al, Ag, Mg, and/or a compound thereof, and may include a transparent layer such as ITO, IZO, ZnO, and/or $In_2O_3$, or a transflective conductive layer. When the common electrode 270 is a reflective electrode, it may include, for example, a layer including Li, Ca, LiF/Ca, LiF/Al, Al, Ag, Mg, and/or a compound thereof. The material and the stacked structure of the common electrode 270 are not limited thereto, and various modifications thereof are possible.

Here, the first electrode 191 is an anode that is a hole injection electrode, and the common electrode 270 is a cathode that is an electron injection electrode. However, the present embodiment is not limited thereto, and the first electrode 191 may be a cathode, and the common electrode 270 may be an anode, according to a driving method of the display device. Holes and electrons are injected into the light emitting layer 370 from the first electrode 191 and the common electrode 270, respectively, and excitons generated by coupling the injected holes and electrons fall from an excited state to a ground state to emit light.

In the meantime, the light emitting layer 370 may include a low molecular organic material or a polymer organic material, such as poly(3,4-ethylenedioxythiophene) (PEDOT). The light emitting layer 370 may include a multilayer including a light emitting layer, and at least one of a hole injecting layer, a hole transporting layer, an electron transporting layer, and an electron injecting layer. When all of these are included, the hole injection layer is located on the first electrode 191, which is an anode, and the hole transport layer, the light emitting layer, the electron transport layer, and an electron injection layer may be sequentially stacked thereon.

However, the present disclosure is not limited thereto, and the light emitting layer 370 may include a quantum dot material. A core of the quantum dot may be selected from Group II-VI compounds, Group III-V compounds, Group IV-VI compounds, Group IV elements, Group IV compounds, and/or combinations thereof.

The Group II-VI compound may be selected from a two-element compound selected from CdSe, CdTe, ZnS, ZnSe, ZnTe, ZnO, HgS, HgSe, HgTe, MgSe, MgS, and/or a mixture thereof; a three-element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and/or a mixture thereof; and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and/or a mixture thereof.

The Group III-V compound may be selected from a two-element compound selected from GaN, GaP, GaAs, GaSb, AlN, AlP, AlAs, AlSb, InN, InP, InAs, InSb, and/or a mixture thereof; a three-element compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and/or a mixture thereof; and a four-element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or a mixture thereof.

The Group IV-VI compound may be selected from a two-element compound selected from SnS, SnSe, SnTe, PbS, PbSe, PbTe, and/or a mixture thereof; a three-element compound selected from SnSeS, SnSeTe, SnSTe, PbSeS, PbSeTe, PbSTe, SnPbS, SnPbSe, SnPbTe, and/or a mixture thereof; and a four-element compound selected from SnPbSSe, SnPbSeTe, SnPbSTe, and/or a mixture thereof. The Group IV element may be selected from Si, Ge, and a mixture thereof. The Group IV compound may be a two-element compound selected from SiC, SiGe, and/or a mixture thereof.

In this case, the two-element compound, the three-element compound, or the four-element compound may be present in particles at uniform concentrations, or they may be divided into states having partially different concentrations to be present in the same particle, respectively. In addition, a core/shell structure in which some quantum dots enclose other quantum dots may be possible. An interface between the core and the shell may have a concentration gradient in which a concentration of elements of the shell decreases closer to its center.

In some embodiments, the quantum dot may have a core-shell structure that includes a core, and a shell surrounding the core. The shell of the quantum dot may serve as a passivation layer for maintaining a semiconductor characteristic, and/or may serve as a charging layer for applying an electrophoretic characteristic to the quantum dot by reducing or preventing chemical denaturation of the core. The shell may be a single layer or a multilayer. An interface between the core and the shell may have a concentration gradient in which a concentration of elements of the shell decreases closer to its center. An example of the shell of the quantum dot includes a metal or nonmetal oxide, a semiconductor compound, or a combination thereof.

For example, the metal or nonmetal oxide may be a two-element compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, $NiO$, and/or the like, or a three-element compound such as $MgAl_2O_4$, $CoFe_2O_4$, $NiFe_2O_4$, $CoMn_2O_4$, and/or the like, but the present disclosure is not limited thereto.

In addition, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like, but the present disclosure is not limited thereto.

The quantum dot may have a full width at half maximum (FWHM) of the light-emitting wavelength spectrum that is equal to or less than about 45 nm, equal to or less than about 40 nm, or equal to or less than about 30 nm, and in this range, color purity or color reproducibility may be improved. In addition, because light emitted through the quantum dot is emitted in all directions, a viewing angle of light may be improved.

Further, a shape of the quantum dot is not particularly limited to a shape generally used in the art, and may be a spherical, pyramidal, multi-arm, or cubic nanoparticle, nanotube, nano-wire, nano-fiber, nano-plate particle shape, and the like.

The quantum dot may control a color of emitted light according to a particle size thereof, and thus the quantum dot may have various light emitting colors such as blue, red, and green.

The encapsulation layer 400 for protecting the light emitting diode may be located on the common electrode 270. The encapsulation layer 400 may be bonded to the substrate 110 by a sealant. The encapsulation layer 400 may be formed of various materials such as glass, quartz, ceramic, plastic, and/or metal.

Although the planar encapsulation layer 400 is shown in the present specification, the present disclosure is not limited thereto, and embodiments may include the encapsulation layer 400 located on the common electrode 270 without using a sealant. In this case, the encapsulation layer 400 may include a single layer of an inorganic film, or a single layer of an organic film, or may include a layer in which an inorganic film and an organic film are alternately stacked. For example, the encapsulation layer 400 may include two inorganic films, and an organic film located between the two inorganic films. The encapsulation layer 400 according to the present embodiment may be located on the common electrode 270, and may be formed to not be spaced apart from the common electrode 270, unlike the structure shown in the drawing.

In the present specification, it has been described that one thin film transistor is located at each pixel in the display area, and that the light emitting diode is connected to the thin film transistor. However, one pixel may include at least two thin film transistors and one capacitor, but it is not limited thereto, and one pixel may include three or more thin film transistors and/or two or more capacitors. Here, the pixel is a minimum unit for displaying an image.

When only the first partition wall 361 is included, the dark spot defect ratio may be in a range of about 10% to about 50%, and when only the second partition wall 362 is included, the dark spot defect ratio may be less than about 1%. However, when only the second partition wall 362 is included, the light leakage phenomenon may occur, or the reliability against external light may be low. The display device according to the present embodiment may include the first partition wall 361 to reduce or prevent the light leakage phenomenon and the out-gassing, and may include the second partition wall 362 to provide a display device having excellent display quality by reducing the dark spot defect ratio.

Hereinafter, a display device according to an embodiment will be described with reference to FIG. 3 to FIG. 11. FIG. 3 to FIG. 11 illustrate a cross-sectional view of a display device according to an embodiment, respectively. A repeated description of the same constituent elements as those described above with reference to FIG. 1 and FIG. 2 may be omitted.

Figure 3:
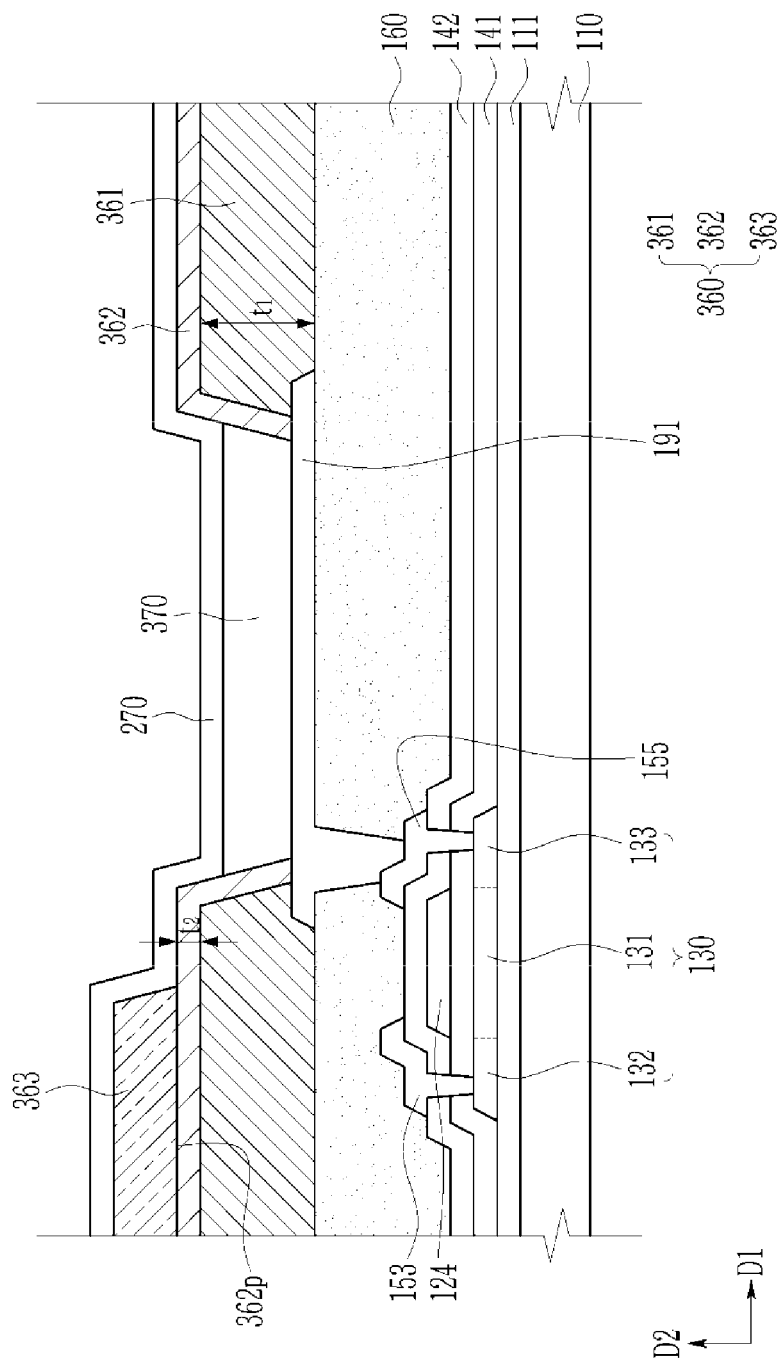
FIG. 3 illustrates a cross-sectional view of a display device according to an embodiment.

Referring first to FIG. 3, the partition wall 360 may be located on the first electrode 191 and the third insulating layer 160. The partition wall 360 includes the first partition wall 361, the second partition wall 362, and a third partition wall 363.

The first partition wall 361 may include an organic insulating material such as an acrylic organic compound, a polyimide, and/or a polyamide, but is not limited thereto. In addition, the first partition wall 361 may further include a photoinitiator and the like. The first partition wall 361 may be formed by using a negative photosensitive resin composition.

The first partition wall 361 may include at least one of a black pigment and a black dye. The black pigment according to the present embodiment may include black pigment particles for absorbing external light, and may include a dispersant bonded to the black pigment particles, but the present embodiment is not limited thereto, and the present embodiment may include only black pigment particles in which a dispersant is omitted. In addition, the black dye according to the present embodiment may include black dye particles for absorbing external light, and may also include a dispersant bonded to the black dye particles, but the present embodiment not limited thereto, and the present embodiment may instead include only the black dye particles in which the dispersant is omitted.

The second partition wall 362 may be located on the first partition wall 361. The second partition wall 362 may overlap a portion of the first electrode 191. The second partition wall 362 may have the same overall thickness.

The maximum thickness $t_1$ of the first partition wall 361 according to the present embodiment may be from about 0.5 micrometers to about 3 micrometers. The maximum thickness $t_2$ of the second partition wall 362 may be from about 0.3 micrometers to about 1 micrometer.

The second partition wall 362 may include an organic insulating material, such as an acrylic organic compound, a polyimide, and/or a polyamide. The second partition wall 362 may be formed by using a positive photosensitive resin composition, but the present embodiment is not limited thereto. Unlike the first partition wall 361, the second partition wall 362 may omit a black pigment or a black dye, and alternatively, the second partition wall 362 may be transparent. The second partition wall 362 may include a compound represented by Chemical Formula 1.

The third partition wall 363 may be located on the second partition wall 362. The third partition wall 363 may be located only on an upper surface 362p of the second partition wall 362. The third partition wall 363 may be formed by a separate process after the second partition wall 362 is formed.

The third partition wall 363 may include the same material as the second partition wall 362. Although the second partition wall 362 and the third partition wall 363 are shown as separate constituent elements in the present example, the second partition wall 362 and the third partition wall 363 including the same material may be seen as a substantially single layer.

The third partition wall 363 may overlap a portion of the second partition wall 362. The third partition wall 363 may function as a spacer, and may support the encapsulation layer as described above.

Figure 4:
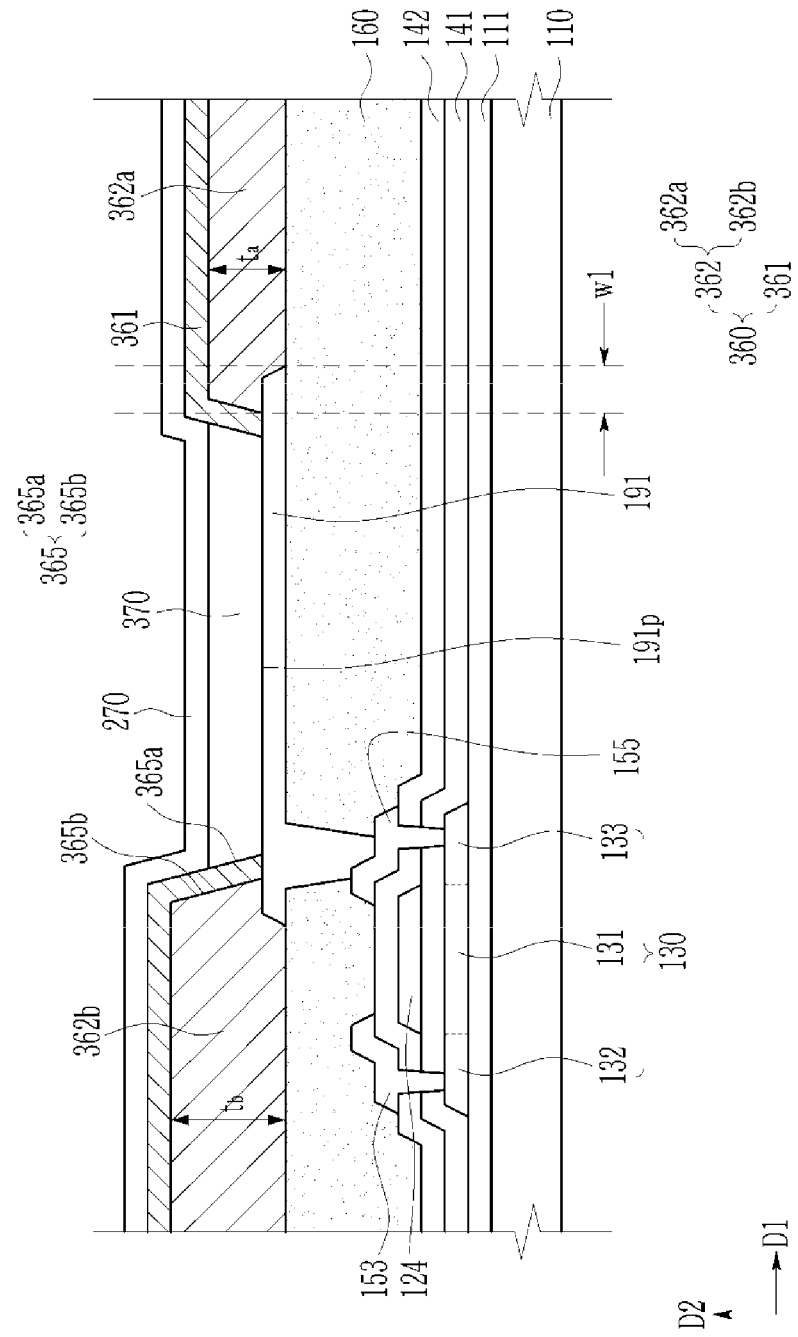
FIG. 4 illustrates a cross-sectional view of a display device according to an embodiment.

Referring to FIG. 4, the partition wall 360 may be located on the first electrode 191 and the third insulating layer 160. The partition wall 360 may include the first partition wall 361 and the second partition wall 362.

The second partition wall 362 may be located on the third insulating layer 160, and the first partition wall 361 may be located on the second partition wall 362. The second partition wall 362 may be located between the first partition wall 361 and the third insulating layer 160. The second partition wall 362 may directly contact the third insulating layer 160, according to the present embodiment.

The second partition wall 362 may include an organic insulating material, such as an acrylic organic compound, a polyimide, and/or a polyamide. The second partition wall 362 may be formed by using a positive photosensitive resin composition, but is not limited thereto. Unlike the first partition wall 361, the second partition wall 362 may omit a black pigment and a black dye, and may be transparent. The second partition wall 362 may include a compound represented by Chemical Formula 1.

The second partition wall 362 may include the first region 362a and the second region 362b. The maximum thickness $t_a$ of the first region 362a and the maximum thickness $t_b$ of the second region 362b may be different. The maximum thickness $t_b$ of the second region 362b may be at least twice the maximum thickness $t_a$ of the first region 362a.

The first region 362a and the second region 362b may be manufactured in the same process. For example, a region overlapping the second opening portion 365b may be manufactured by being exposed by a mask opening, a region overlapping the first region 362a may be manufactured by overlapping a halftone mask, and a region overlapping the second region 362b may be manufactured by overlapping a mask light blocking portion. The portion exposed by the mask opening portion may be eliminated to form the second opening portion 365b, and the region overlapping the mask light blocking portion may form the second region 362b with the second thickness $t_b$, while the region overlapping the halftone mask may form the first region 362a with the first thickness $t_a$. In this case, the region overlapping the halftone mask may have the first thickness $t_a$ that is changed according to the exposure amount. As the exposure amount increases, the first thickness $t_a$ may be reduced. However, even if the exposure amount increases, the second thickness $t_b$ may remain constant.

The first partition wall 361 may be located on the second partition wall 362. The first partition wall 361 may overlap a portion of the first electrode 191. In this case, the end of the first partition wall 361 may contact the upper surface 191*p* of the first electrode 191.

The size of the first opening portion 365*a* of the first partition wall 361, and the size of the second opening portion 365*b* of the second partition wall 362, may be different. The planar size of the first opening portion 365*a* of the first partition wall 361 may be smaller than that of the second opening portion 365*b* of the second partition wall 362. A lateral surface defining the second opening portion 365*b* may be in contact with the first partition wall 361. The first partition wall 361 may surround the lateral surface of the second opening portion 365*b* (e.g., may surround the lateral surface of the second partition wall 362). The end of the first partition wall 361 may contact the upper surface 191*p* of the first electrode 191 while being located inside the second opening portion 365*b*.

The first partition wall 361 may include an organic insulating material such as an acrylic organic compound, a polyimide, and/or a polyamide, but is not limited thereto. In addition, the first partition wall 361 may further include a photoinitiator and the like. The first partition wall 361 may be formed by using a negative photosensitive resin composition.

The first partition wall 361 according to the present embodiment may include at least one of a black pigment and a black dye. The black pigment according to the present embodiment may include black pigment particles for absorbing external light, and may include a dispersant bonded to the black pigment particles, but the black pigment is not limited thereto. For example, the black pigment may include only the black pigment particles in which the dispersant is omitted. The black dye according to the present embodiment may include black dye particles for absorbing external light, and may include a dispersant bonded to the black dye particles, but is not limited thereto. For example, the black dye may include only the black dye particles in which the dispersant is omitted.

Figure 5:
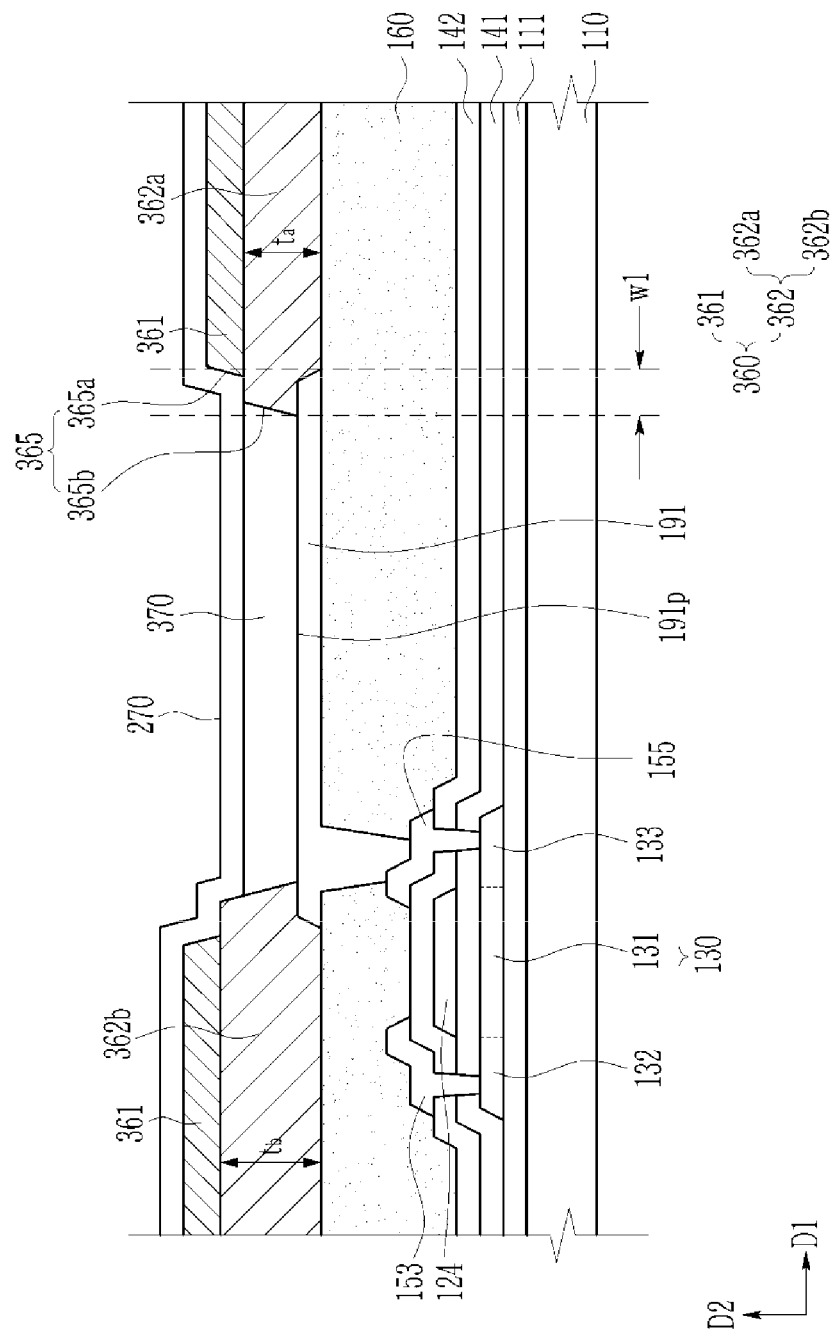
FIG. 5 illustrates a cross-sectional view of a display device according to an embodiment.

Next, referring to FIG. 5, the second partition wall 362 and the first partition wall 361 may be sequentially located on the first electrode 191 and the third insulating layer 160.

The second partition wall 362 may include an organic insulating material such as an acrylic organic compound, a polyimide, and/or a polyamide. The second partition wall 362 may be formed by using a positive photosensitive resin composition, but is not limited thereto. Unlike the first partition wall 361, the second partition wall 362 may exclude a black pigment and a black dye, and may be transparent. The second partition wall 362 may include a compound represented by Chemical Formula 1.

The second partition wall 362 may include the first region 362*a* and the second region 362*b*. The maximum thickness $t_a$ of the first region 362*a* and the maximum thickness $t_b$ of the second region 362*b* may be different. The maximum thickness $t_b$ of the second region 362*b* may be at least twice the maximum thickness $t_a$ of the first region 362*a*.

The first partition wall 361 may be located above the second partition wall 362, and might not contact the first electrodes 191. Although the embodiment in which the first partition wall 361 is located only on the upper surface 362*p* of the second partition wall 362 is illustrated herein, the present disclosure is not limited thereto. For example, in the present embodiment, the first partition wall 361 may have any structure that does not contact the upper surface 191*p* of the first electrode 191 while overlapping the lateral surface of the second partition wall 362.

The first partition wall 361 according to the present embodiment may include at least one of a black pigment and a black dye. The black pigment according to the present embodiment may include black pigment particles for absorbing external light, and may include a dispersant bonded to the black pigment particles, but is not limited thereto, and may include only black pigment particles while omitting a dispersant. The black dye according to the present embodiment may include black dye particles for absorbing external light, and a dispersant bonded to the black dye particles, but is not limited thereto, and may include only the black dye particles in which the dispersant is omitted.

The size of the first opening portion 365*a* of the first partition wall 361 and the size of the second opening portion 365*b* of the second partition wall 362 may be different. The planar size of the first opening portion 365*a* of the first partition wall 361 may be larger than the planar size of the second opening portion 365*b* of the second partition wall 362.

Figure 6:
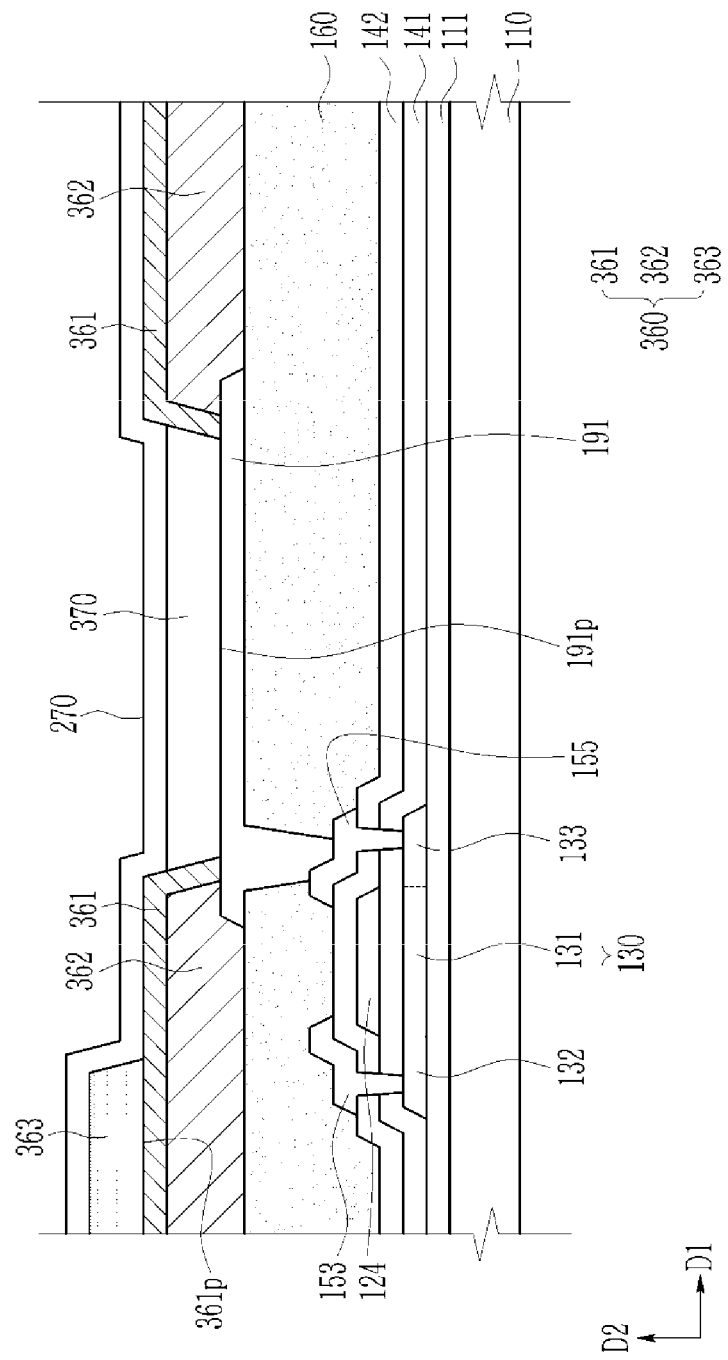
FIG. 6 illustrates a cross-sectional view of a display device according to an embodiment.

Referring to FIG. 6, the second partition wall 362, the first partition wall 361, and the third partition wall 363 may be sequentially located on the first electrode 191 and the third insulating layer 160.

The second partition wall 362 may include an organic insulating material such as an acrylic organic compound, a polyimide, and/or a polyamide. The second partition wall 362 may be formed by using a positive photosensitive resin composition as an example, but is not limited thereto. Unlike the first partition wall 361, the second partition wall 362 may omit a black pigment and a black dye, and may be transparent. The second partition wall 362 may include a compound represented by Chemical Formula 1.

The first partition wall 361 may be located on the second partition wall 362. The first partition wall 361 may overlap a portion of the first electrode 191. In this case, the end of the first partition wall 361 may contact the upper surface 191*p* of the first electrode 191.

The first partition wall 361 according to the present embodiment may include at least one of a black pigment and a black dye. The black pigment according to the present embodiment may include black pigment particles for absorbing external light, and a dispersant bonded to the black pigment particles, but is not limited thereto, and may include only the black pigment particles in which the dispersant is omitted. The black dye according to the present embodiment may include black dye particles for absorbing external light, and a dispersant bonded to the black dye particles, but is not limited thereto, and may include only the black dye particles in which the dispersant is omitted.

The third partition wall 363 may be located on the first partition wall 361. The third partition wall 363 may overlap an upper surface 361*p* of the first partition wall 361. In addition, the third partition wall 363 may include the same material as the second partition wall 362.

The third partition wall 363 may overlap a portion of the first partition wall 361. The second partition wall 362, the first partition wall 361, and the third partition wall 363 may overlap each other in a region in which the third partition wall 363 is located, and the region may support the above-mentioned encapsulation layer or the like, like a spacer.

Figure 7:
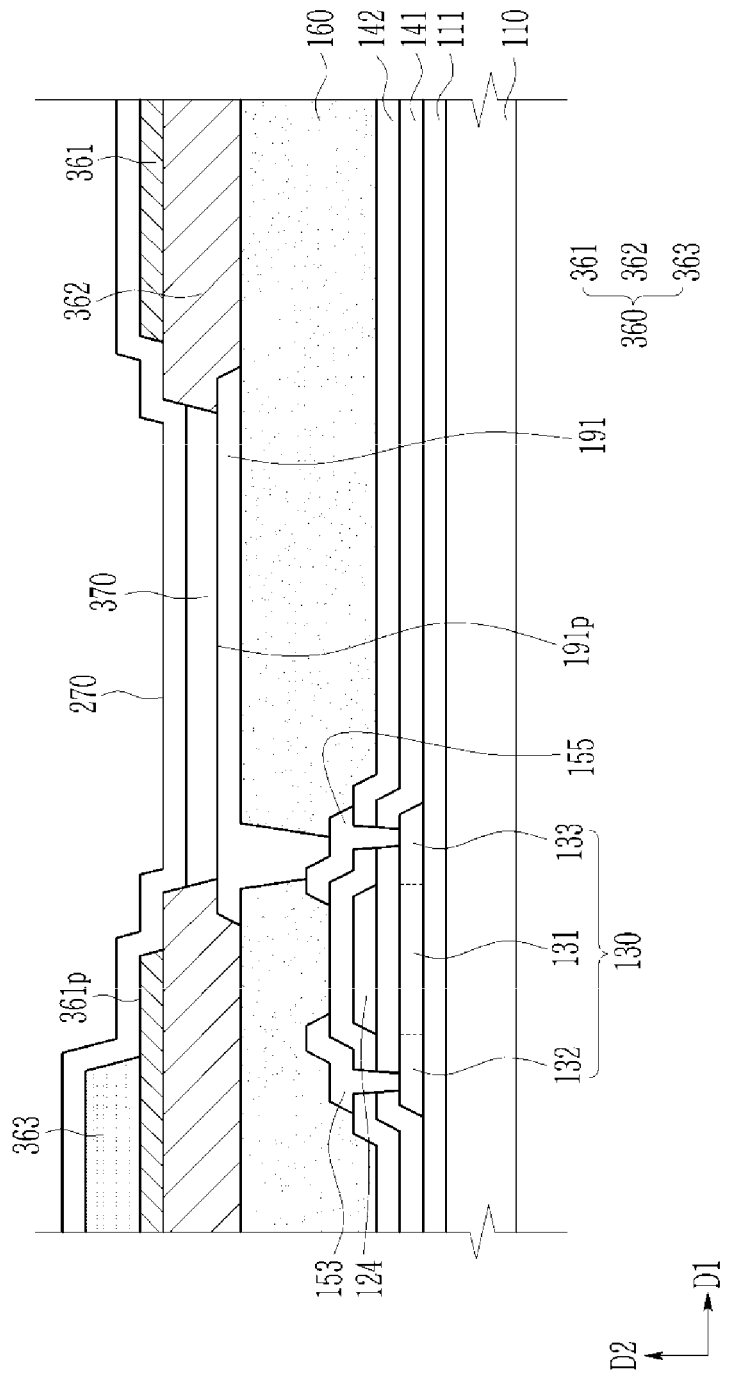
FIG. 7 illustrates a cross-sectional view of a display device according to an embodiment.

Referring to FIG. 7, the second partition wall 362, the first partition wall 361, and the third partition wall 363 may be sequentially located on the first electrode 191 and the third insulating layer 160.

The second partition wall 362 may overlap the first electrode 191 while being located on the third insulating layer 160.

The second partition wall 362 may include an organic insulating material such as an acrylic organic compound, a polyimide, and/or a polyamide. The second partition wall 362 may be formed by using a positive photosensitive resin composition, but is not limited thereto. Unlike the first partition wall 361, the second partition wall 362 may omit a black pigment and a black dye, and may be transparent. The second partition wall 362 may include a compound represented by Chemical Formula 1.

The first partition wall 361 may be located on the second partition wall 362. Although the embodiment in which the first partition wall 361 is located only on the upper surface 362p of the second partition wall 362 is illustrated herein, the present disclosure is not limited thereto, and the first partition wall may overlap the lateral surface of the second partition wall 362. However, the first partition wall 361 may be positioned to not contact the upper surface 191p of the first electrode 191.

The first partition wall 361 according to the present embodiment may include a black pigment and a black dye. The black pigment according to the present embodiment may include black pigment particles for absorbing external light, and a dispersant bonded to the black pigment particles, but is not limited thereto, and may include only the black pigment particles in which the dispersant is omitted. In addition, the black dye according to the present embodiment may include black dye particles for absorbing external light and a dispersant bonded to the black dye particles, but is not limited thereto, and may include only the black dye particles in which the dispersant is omitted.

The third partition wall 363 may be located on the first partition wall 361. The third partition wall 363 may overlap the upper surface 361p of the first partition wall 361. The second partition wall 362, the first partition wall 361, and the third partition wall 363 overlap each other in a region in which the third partition wall 363 is located, and the region may serve as a spacer.

The third partition wall 363 may include the same material as the second partition wall 362.

Figure 8:
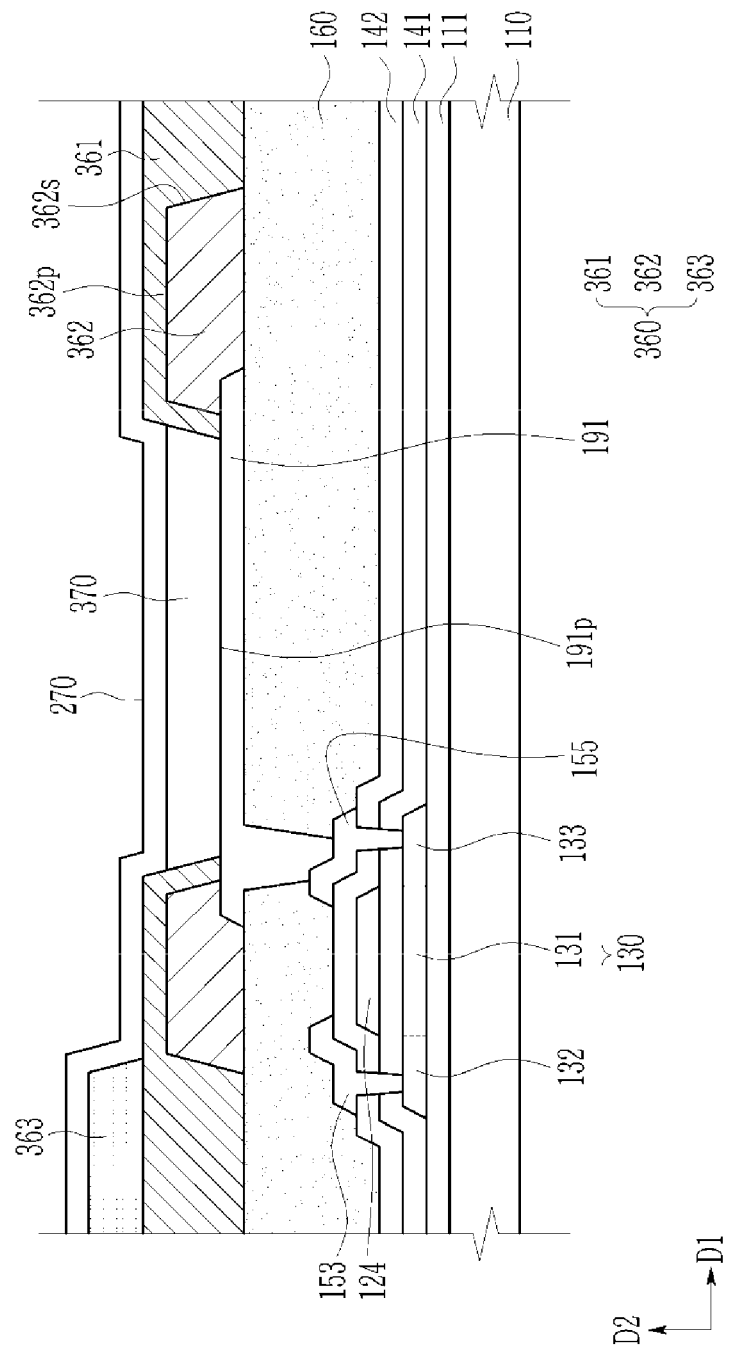
FIG. 8 illustrates a cross-sectional view of a display device according to an embodiment.

Referring to FIG. 8, the second partition wall 362, the first partition wall 361, and the third partition wall 363 may be located on the third insulating layer 160 and the first electrode 191.

The second partition wall 362 may overlap the end of the first electrode 191. The end of the first electrode 191 may be covered by the second partition wall 362. A metal included in the first electrode 191 may be controlled to not grow into a metal defect due to the second partition wall 362.

The second partition wall 362 may be made of a transparent material. The second partition wall 362 may include an organic insulating material such as an acrylic organic compound, a polyimide, and/or a polyamide. The second partition wall 362 may be formed by using a positive photosensitive resin composition as an example, but is not limited thereto. Unlike the first partition wall 361, the second partition wall 362 may omit a black pigment and a black dye. The second partition wall 362 may include a compound represented by Chemical Formula 1.

The first partition wall 361 may be located on the third insulating layer 160, the second partition wall 362, and the first electrode 191. The first partition wall 361 may have a shape that surrounds or contacts the upper surface 362p and the lateral surface 362s of the second partition wall 362 in a cross-sectional view. The first partition wall 361 may contact the upper surface 191p of the first electrode 191 while surrounding or contacting the lateral surface 362s of the second partition wall 362.

The first partition wall 361 according to the present embodiment may include at least one of a black pigment and a black dye. The black pigment according to the present embodiment may include black pigment particles for absorbing external light and a dispersant bonded to the black pigment particles, but is not limited thereto, and may include only the black pigment particles in which the dispersant is omitted. In addition, the black dye according to the present embodiment may include black dye particles for absorbing external light and a dispersant bonded to the black dye particles, but is not limited thereto, and may include only the black dye particles in which the dispersant is omitted.

The third partition wall 363 may be located on the first partition wall 361. The third partition wall 363 may include the same material as the second partition wall 362. The third partition wall 363 may overlap a portion of the second partition wall 362.

The third partition wall 363 may overlap a portion of the first partition wall 361. A region in which the third partition wall 363 is located corresponds to a region in which the second partition wall 362, the first partition wall 361, and the third partition wall 363 are stacked, and the region may serve as a spacer.

Figure 9:
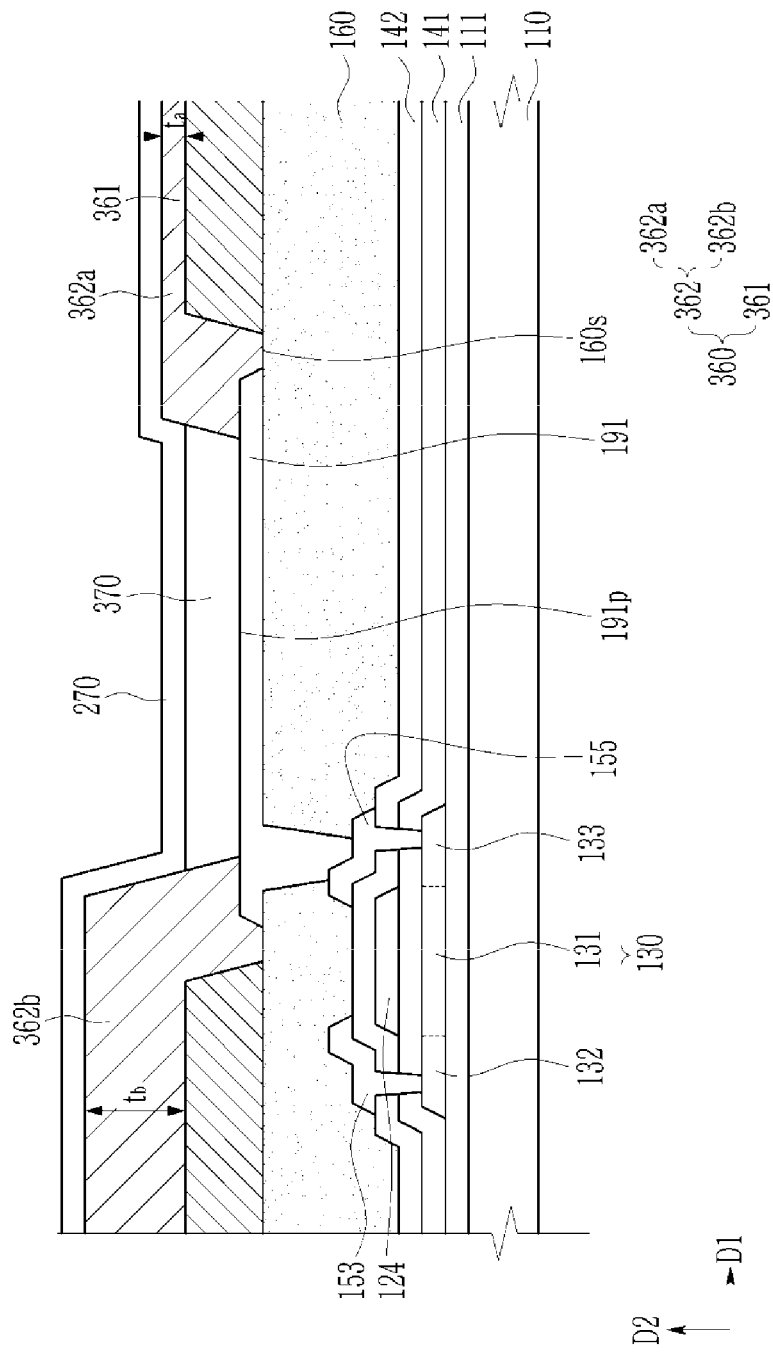
FIG. 9 illustrates a cross-sectional view of a display device according to an embodiment.

Referring to FIG. 9, the first partition wall 361 may be located on the third insulating layer 160. In this case, the first partition wall 361 may be positioned to not overlap the first electrodes 191. The first electrode 191 and the first partition wall 361 may be spaced apart from each other in a plan view.

The second partition wall 362 may be located on the third insulating layer 160, the first electrode 191, and the first partition wall 361. The second partition wall 362 may be located in a space(s) between the first electrode 191 and the first partition wall 361. The second partition wall 362 may be in contact with an upper surface 160s of the third insulating layer 160 through the space(s).

The second partition wall 362 may include the first region 362a and the second region 362b. The maximum thickness $t_a$ of the first region 362a and the maximum thickness $t_b$ of the second region 362b may be different. The maximum thickness $t_b$ of the second region 362b may be at least twice the maximum thickness $t_a$ of the first region 362a.

The second region 362b of the second partition wall 362 may have a relatively thick thickness. The second region 362b may serve as a spacer. The second partition wall 362 may have elasticity (e.g., predetermined elasticity), and may support the encapsulation layer 400 described above.

The second partition wall 362 may include an organic insulating material, such as an acrylic organic compound, a polyimide, and/or a polyamide. The second partition wall 362 may be formed by using a positive photosensitive resin composition as an example, but is not limited thereto. Unlike the first partition wall 361, the second partition wall 362 may omit a black pigment and a black dye, and may be transparent. The second partition wall 362 may include a compound represented by Chemical Formula 1.

Figure 10:
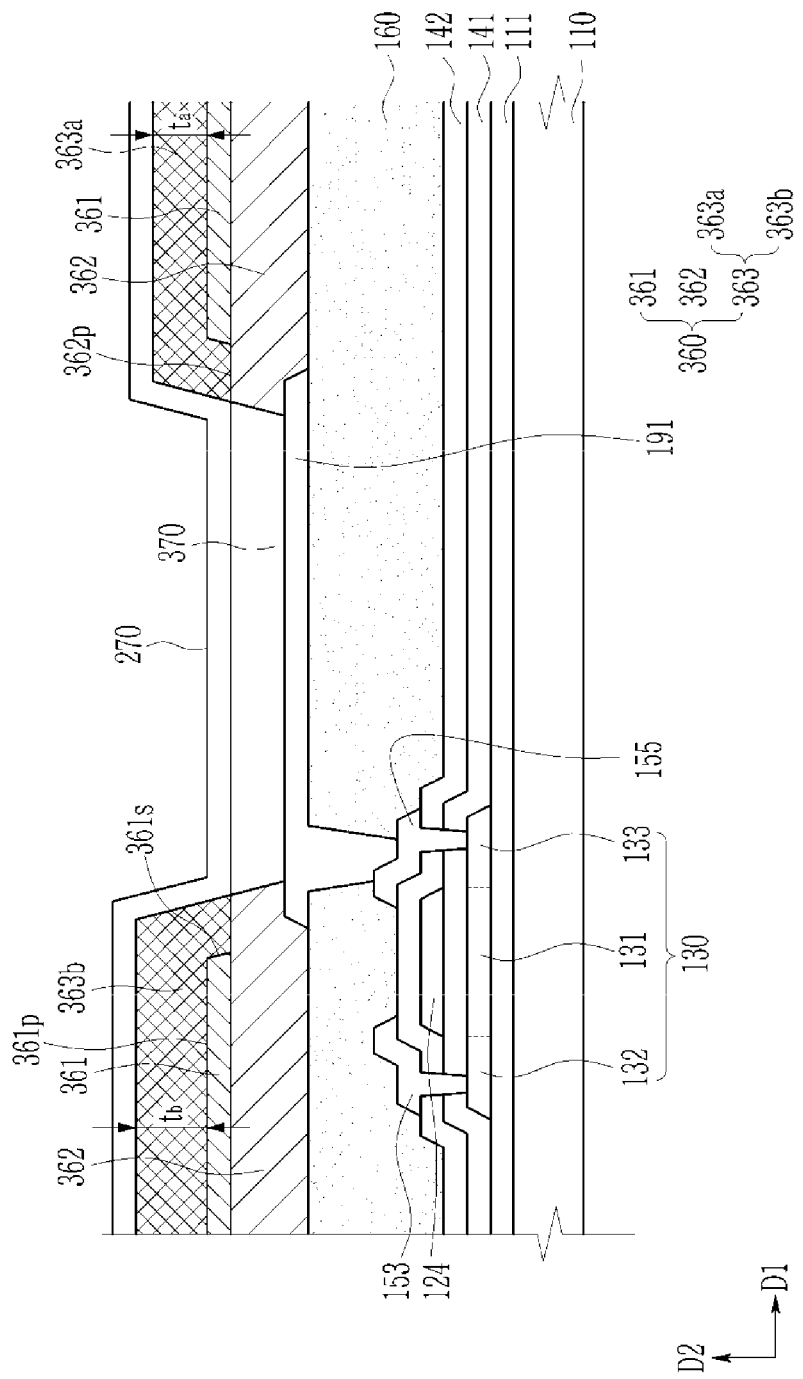
FIG. 10 illustrates a cross-sectional view of a display device according to an embodiment.

Referring to FIG. 10, the second partition wall 362, the first partition wall 361, and the third partition wall 363 may be sequentially located on the first electrode 191 and the third insulating layer 160.

The second partition wall 362 may overlap a portion of the first electrode 191. The second partition wall 362 may include an organic insulating material such as an acrylic organic compound, a polyimide, and/or a polyamide. The second partition wall 362 may be formed by using a positive photosensitive resin composition as an example, but is not limited thereto. Unlike the first partition wall 361, the second partition wall 362 may omit a black pigment and a black dye, and may be transparent. The second partition wall 362 may include a compound represented by Chemical Formula 1.

The first partition wall 361 may be located on the second partition wall 362. The first partition wall 361 according to the present embodiment may overlap the upper surface 362p of the second partition wall 362.

The third partition wall 363 may be located on the second partition wall 362 and the first partition wall 361. The third partition wall 363 may overlap a lateral surface 361s of the first partition wall 361 while covering the upper surface 361p of the first partition wall 361. The third partition wall 363 may overlap the upper surface 362p of the second partition wall 362. Although an embodiment in which edges of the third partition wall 363 and the second partition wall 362 are aligned is illustrated herein, the present disclosure is not limited thereto, and the end of the third partition wall 363 may overlap the lateral surface of the second partition wall 362.

The third partition wall 363 may include a first region 363a and a second region 363b. The maximum thickness $t_a$ of the first region 363a and the maximum thickness $t_b$ of the second region 363b may be different. For example, the maximum thickness $t_b$ of the second region 363b may be at least twice the maximum thickness $t_a$ of the first region 363a.

The second partition wall 362, the first partition wall 361, and the second region 363b of the third partition wall 363 may overlap each other in a region in which the second region 363b is located, and the region may serve as a spacer. The second region 363b may support the encapsulation layer described above.

Figure 11:
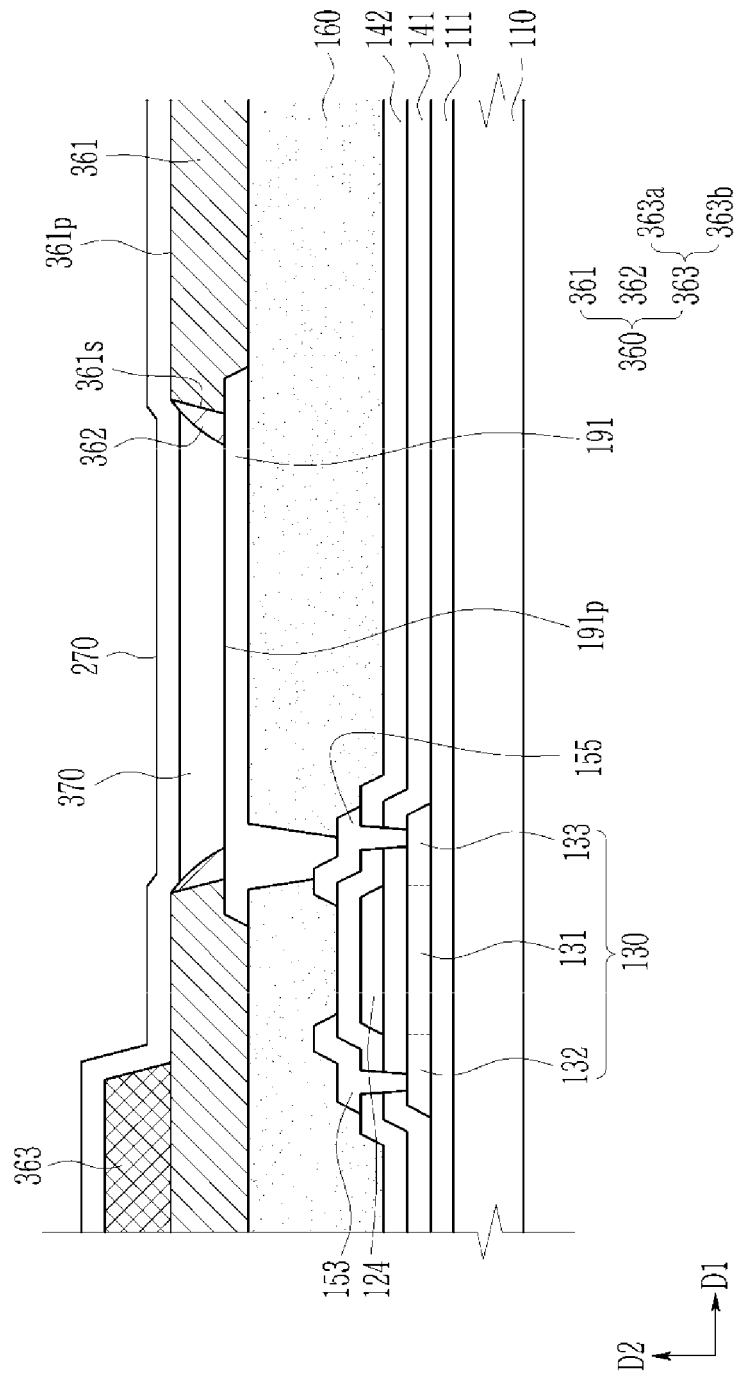
FIG. 11 illustrates a cross-sectional view of a display device according to an embodiment.

Referring to FIG. 11, the partition wall 360 may be located on the first electrode 191 and the third insulating layer 160. The partition wall 360 includes the first partition wall 361, the second partition wall 362, and a third partition wall 363.

The first partition wall 361 may overlap a portion of the first electrode 191, and may be located on the upper surface of the third insulating layer 160.

The first partition wall 361 may include an organic insulating material such as an acrylic organic compound, a polyimide, and/or a polyamide, but is not limited thereto. In addition, the first partition wall 361 may further include a photoinitiator and the like. Further, the first partition wall 361 may be formed by using a negative photosensitive resin composition.

The first partition wall 361 according to the present embodiment may include at least one of a black pigment and a black dye. The black pigment according to the present embodiment may include black pigment particles for absorbing external light and a dispersant bonded to the black pigment particles, but is not limited thereto, and may include only the black pigment particles in which the dispersant is omitted. In addition, the black dye according to the present embodiment may include black dye particles for absorbing external light and a dispersant bonded to the black dye particles, but is not limited thereto, and may include only the black dye particles in which the dispersant is omitted.

The second partition wall 362 may be located on the upper surface 191p of the first electrode 191. The second partition wall 362 overlaps the first electrodes 191 while overlapping the lateral surfaces 361s of the first partition wall 361. The second partition wall 362 may have a shape that surrounds a lateral surface of the opening portion of the first partition wall 361. The described metal defect may otherwise easily occur at a boundary between the first partition wall 361 and the first electrode 191, and the growth of the metal defect may be reduced or prevented by surrounding the boundary with the second partition wall 362.

The second partition wall 362 may include an organic insulating material such as an acrylic organic compound, a polyimide, and/or a polyamide. The second partition wall 362 may be formed by using a positive photosensitive resin composition as an example, but is not limited thereto. Unlike the first partition wall 361, the second partition wall 362 may omit a black pigment and a black dye, and alternatively, may be transparent. The second partition wall 362 may include a compound represented by Chemical Formula 1.

The third partition wall 363 may be located on the upper surface 361p of the first partition wall 361. The third partition wall 363 may include the same material as the second partition wall 362. The third partition wall 363 may function as a spacer, and may support the encapsulation layer as described above.

Figure 12A:
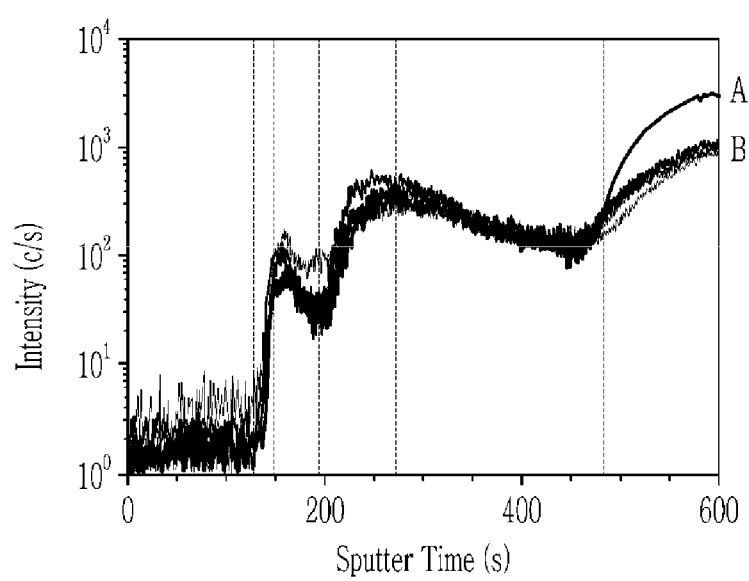
FIG. 12A illustrates a graph of the content of 'S' according to an embodiment.
Figure 13:
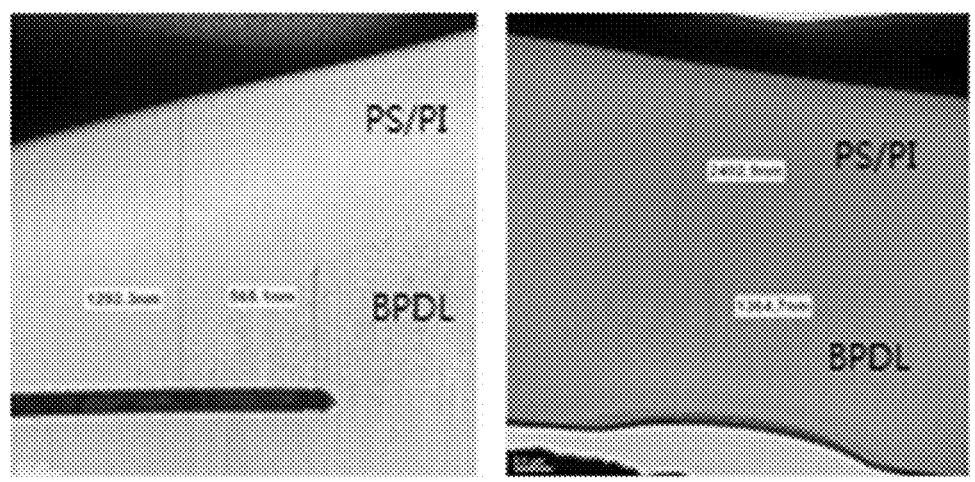
FIG. 13 illustrates TEM images of a first partition wall and a second partition wall.
Figure 14:
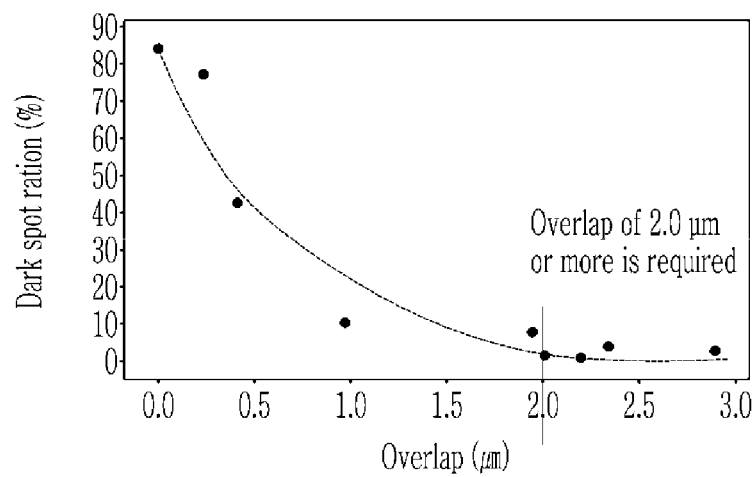
FIG. 14 illustrates a graph of a dark spot ratio with respect to a width at which a first electrode and a second partition wall overlap.

Hereinafter, the display device according to the present embodiment will be described with reference to FIG. 12A to FIG. 14. FIG. 12A is a graph of the content of 'S' according to the present embodiment, FIG. 12B is an EDS analysis image with respect to the first partition wall and the second partition wall, FIG. 13 is a TEM image with respect to the first partition wall and the second partition wall, and FIG. 14 is a graph of a dark spot ratio according to a width at which the first electrode and the second partition wall overlap.

The second partition wall according to the present embodiment may be formed of a transparent material, and may include a compound represented by Chemical Formula 1. In addition, the first partition wall may include a black pigment.

Referring to FIG. 12A, as a sputter time elapses, the S element contents of the capping layer, the cathode, the electron auxiliary layer, the light emitting layer, the hole auxiliary layer, and the partition wall included in the display device may be sequentially compared. The S element content shows similar results when the sputter time is in a range of about 0 to about 500 seconds (a region corresponding to the capping layer, the cathode, the electron auxiliary layer, the light emitting layer, and the hole auxiliary layer). The partition wall according to the present embodiment corresponds to a case of about 500 to about 600 seconds in FIG. 12A. Because the second partition wall A includes the compound represented by Chemical Formula 1, it can be seen that the intensity of the S element to the first partition wall B increases as the TOF-SIMS analysis is performed. That is, the first partition wall B and the second partition wall A may be distinguished by analyzing the content of the S element as shown in FIG. 12A.

Figure 12B:
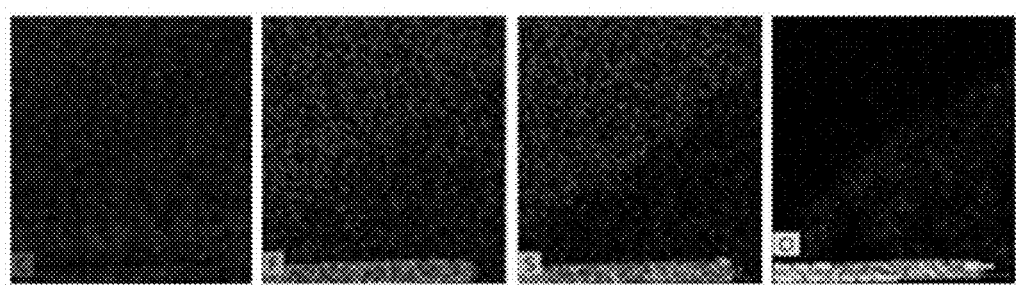
FIG. 12B illustrates EDS analysis images of a first partition wall and a second partition wall.

Referring to FIG. 12B, which is an EDS analysis image with respect to the first and second partition walls, it is difficult to distinguish the first and second partition walls by the elements C, F, and Cl, but the first and second partition walls may be distinguished by a difference between the S element contents thereof. In addition, as shown in FIG. 13, it can be seen that the first partition wall (BPDL) and the second partition wall (PS/PI) are also divided into separate layers through the TEM image.

Referring to FIG. 14, the dark spot ratio with respect to the increase of the width (overlap) at which the second partition wall overlaps the first electrode is illustrated. The dark spot ratio according to changing the first width corresponding to w1 of FIG. 1 is as shown in FIG. 14. When the width corresponding to w1 is 0, that is, when the overlap width of the second partition wall and the first electrode is zero, the dark spot ratio may be about 84%. As the overlap width increases, the dark spot ratio decreases, and when the overlap width is about 2.2 micrometers or more, the dark spot ratio may be substantially 0%, and may be appropriate for the width at which the second partition wall overlaps the first electrode to be at least 2.0 micrometers.

While embodiments of the present disclosure been described in connection with what is presently considered to be practical embodiments, it is to be understood that the invention is not limited to the disclosed embodiments, but, on the contrary, is intended to cover various modifications and equivalent arrangements included within the spirit and scope of the appended claims, with functional equivalents thereof to be included therein.

DESCRIPTION OF SYMBOLS

110: substrate
191: first electrode
370: light emitting layer
270: second electrode
361: first partition wall
362: second partition wall

What is claimed is:

1. A display device comprising:
   a substrate;
   a thin film transistor on the substrate;
   a first electrode electrically connected to the thin film transistor;
   a light emitting layer and a second electrode overlapping the first electrode;
   a first partition wall between the first electrode and the second electrode;
   a second partition wall overlapping the first partition wall; and
   a third partition wall on the second partition wall,
   wherein the first partition wall comprises at least one of a black pigment and a black dye,
   wherein the second partition wall comprises an organic insulating material,
   wherein a portion of the second partition wall overlaps the first electrode, and
   wherein a first maximum distance from the substrate to the second electrode in a thickness direction on a first side of the light emitting layer is different than a second maximum distance from the substrate to the second electrode in a thickness direction on a second side of the light emitting layer due to the third partition wall being on only one of the first side or the second side, or due to the third partition wall having different respective thicknesses on the first side and on the second side.

2. The display device of claim 1, wherein an end of the second partition wall contacts the first electrode, and
   wherein a width of an area at which the second partition wall and the first electrode contact each other is about 2 micrometers or more.

3. The display device of claim 1, wherein the second partition wall comprises a first region and a second region that have different thicknesses.

4. The display device of claim 3, wherein the display device further comprises an encapsulation layer on the second electrode, and
   wherein the second region supports the encapsulation layer.

5. The display device of claim 1, wherein the first electrode comprises a first layer, a second layer, and a third layer,
   wherein each of the first layer and the third layer comprises ITO, IZO, ZnO, $In_2O_3$, IGO, or AZO, and
   wherein the second layer comprises Ag, Mg, Al, Pt, Pd, Au, Ni, Nd, Ir, Cr, or a compound thereof.

6. The display device of claim 5, wherein a surface of the first electrode defines a groove exposing the second layer.

7. The display device of claim 1, wherein the second partition wall is on the first electrode, and
   wherein the first partition wall is on the second partition wall.

8. The display device of claim 7, wherein the second partition wall comprises a first region and a second region that have different thicknesses.

9. The display device of claim 7, wherein the first partition wall is on an upper surface of the second partition wall.

10. The display device of claim 9, wherein the first partition wall overlaps the upper surface and two lateral surfaces of the second partition wall.

11. The display device of claim 1, wherein the third partition wall and the second partition wall comprise a same material.

12. The display device of claim 1, wherein the third partition wall contacts an upper surface of the second partition wall.

13. The display device of claim 1, further comprising an insulating layer between the thin film transistor and the first electrode,
    wherein the first partition wall and the second partition wall contact the insulating layer.

14. A display device comprising:
    a substrate;
    a thin film transistor on the substrate;
    a first electrode connected to the thin film transistor;
    an insulating layer between the first electrode and the thin film transistor;
    a first partition wall and a second partition wall overlapping the insulating layer the second partition wall comprising a first region and a second region having different thicknesses; and
    a light emitting layer and a second electrode overlapping the first electrode,
    wherein an end of the second partition wall contacts an upper surface of the first electrode, and
    wherein a first maximum distance from the substrate to the second electrode in a thickness direction on a first side of the light emitting layer is different than a second maximum distance from the substrate to the second electrode in a thickness direction on a second side of the light emitting layer due to the first region and the second region having different thicknesses.

15. The display device of claim 14, wherein an amount of at least one of a black pigment and a black dye in the first partition wall is greater than an amount of at least one of a black pigment and a black dye comprised in the second partition wall.

16. The display device of claim 14, further comprising an encapsulation layer,
    wherein a thickness of the second region is greater than that of the first region, and
    wherein the second region supports the encapsulation layer.

17. The display device of claim 14, wherein the light emitting layer comprises a quantum dot.

18. The display device of claim 14, wherein the second partition wall contacts a lateral surface of the first partition wall and an upper surface of the first electrode.

19. The display device of claim 14, wherein the first partition wall is spaced apart from the first electrode.

20. A display device comprising:
- a substrate;
- a thin film transistor on the substrate;
- a first electrode connected to the thin film transistor;
- an insulating layer between the first electrode and the thin film transistor;
- a first partition wall and a second partition wall overlapping the insulating layer; and
- a light emitting layer and a second electrode overlapping the first electrode,
- wherein an end of the second partition wall contacts an upper surface of the first electrode, and
- wherein an amount of sulfur (S) in the first partition wall is less than an amount of sulfur (S) in the second partition wall.

* * * * *